US012036887B2

(12) United States Patent
Iida et al.

(10) Patent No.: US 12,036,887 B2
(45) Date of Patent: Jul. 16, 2024

(54) BATTERY MANAGEMENT SYSTEM

(71) Applicant: DENSO CORPORATION, Kariya (JP)

(72) Inventors: Takeshi Iida, Kariya (JP); Shogo Shigemori, Kariya (JP); Tatsuhiro Numata, Kariya (JP)

(73) Assignee: DENSO CORPORATION, Kariya (JP)

( * ) Notice: Subject to any disclaimer, the term of this patent is extended or adjusted under 35 U.S.C. 154(b) by 333 days.

(21) Appl. No.: 17/687,065

(22) Filed: Mar. 4, 2022

(65) Prior Publication Data
US 2022/0281347 A1 Sep. 8, 2022

(30) Foreign Application Priority Data

Mar. 8, 2021 (JP) .................................. 2021-036509
Sep. 13, 2021 (JP) .................................. 2021-148880

(51) Int. Cl.
*B60L 58/10* (2019.01)
*G01R 31/371* (2019.01)
*H04W 24/04* (2009.01)
*H04W 76/10* (2018.01)

(52) U.S. Cl.
CPC ............ *B60L 58/10* (2019.02); *G01R 31/371* (2019.01); *H04W 24/04* (2013.01); *H04W 76/10* (2018.02); *B60L 2270/00* (2013.01)

(58) Field of Classification Search
CPC ........... B60L 2240/54; B60L 2240/545; B60L 2240/547; B60L 2240/549; B60L 2270/00; B60L 50/64; B60L 58/10; G01R 31/371; H02J 7/00036; H02J 7/0047; H02J 7/0048; H02J 7/005; H02J 7/1423; H04W 24/04
See application file for complete search history.

(56) References Cited

U.S. PATENT DOCUMENTS

2016/0268642 A1 9/2016 Yamazoe et al.
2021/0344580 A1* 11/2021 Jeon ........................ B60L 53/66
2022/0221524 A1* 7/2022 Sundaraaman ....... H02J 7/0013

\* cited by examiner

*Primary Examiner* — Charles J Han
(74) *Attorney, Agent, or Firm* — Posz Law Group, PLC

(57) ABSTRACT

A battery management system includes a monitoring device and a control device. The control device transmits request data requesting transmission of battery information, and the monitoring device transmits response data including the battery information to the control device. The control device makes next request data include communication establishment information and transmits the next request data. The monitoring device includes a transmission buffer capable of individually accumulating the battery information for multiple times. The monitoring device deletes the battery information corresponding to communication establishment from the transmission buffer, and holds the battery information corresponding to communication failure in the transmission buffer based on the communication establishment information.

10 Claims, 13 Drawing Sheets

BATTERY MANAGEMENT SYSTEM

CROSS REFERENCE TO RELATED APPLICATION

The present application claims the benefit of priority from Japanese Patent Application No. 2021-036509 filed on Mar. 8, 2021 and Japanese Patent Application No. 2021-148880 filed on Sep. 13, 2021. The entire disclosures of the above applications are incorporated herein by reference.

TECHNICAL FIELD

The present disclosure relates to a battery management system.

BACKGROUND

JP 6093448 B2 discloses a battery management system. The disclosure of JP 6093448 B2 is incorporated herein by reference as an explanation of technical elements in the present disclosure.

SUMMARY

The present disclosure provides a battery management system including a monitoring device and a control device. The control device transmits request data requesting transmission of battery information, and the monitoring device transmits response data including the battery information to the control device. The control device makes next request data include communication establishment information and transmits the next request data. The monitoring device includes a transmission buffer capable of individually accumulating the battery information for multiple times. The monitoring device deletes the battery information corresponding to communication establishment from the transmission buffer, and holds the battery information corresponding to communication failure in the transmission buffer based on the communication establishment information.

BRIEF DESCRIPTION OF DRAWINGS

Objects, features and advantages of the present disclosure will become apparent from the following detailed description made with reference to the accompanying drawings. In the drawings.

DETAILED DESCRIPTION

Figure 1:
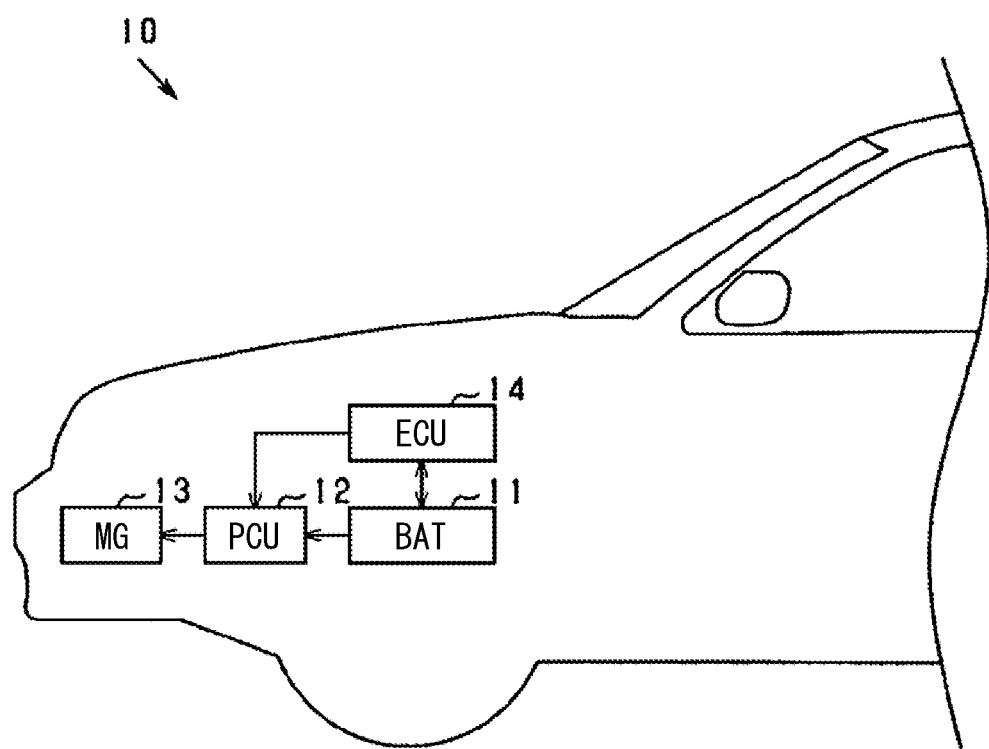
FIG. 1 is a diagram showing a vehicle equipped with a battery pack.

When an assembled battery management device continuously detects a communication error with respect to a first battery cell management device, the assembled battery management device determines that wireless communication with the first battery management cell device is impossible. Then, the assembled battery management device performs wireless communication with the first battery cell management device via a second battery cell management device different from the first battery cell management device. In this way, with the occurrence of communication failure between the battery cell management device (monitoring device) and the assembled battery management device (control device), an omission of data including battery information may occur. In the above-mentioned viewpoints or in other viewpoints not mentioned, further improvements are required in battery management systems.

A battery management system according to an aspect of the present disclosure includes a monitoring device and a control device. The monitoring device includes a monitoring unit configured to acquire and monitor battery information indicating a battery status, and a wireless circuit unit configured to transmit and receive data to and from the monitoring unit and capable of performing wireless communication. The control device is configured to perform wireless communication with the wireless circuit unit and execute a predetermined process based on the battery information. The control device is further configured to transmit request data requesting transmission of the battery information to the monitoring device. The monitoring device is configured to transmit response data including the battery information to the control device in response to receiving the request data. The control device is further configured to make next request data include communication establishment information that is capable of distinguishing between communication establishment in which the response data with respect to the request data is normally received and communication failure in which the response data with respect to the request data is not normally received, and transmit the next request data. The request data includes periodic data transmitted in a predetermined cycle. The wireless circuit unit includes a transmission buffer capable of individually accumulating the battery information for multiple times that is acquired by the monitoring unit. The wireless circuit unit is further configured to transmit, to the control device, the battery information for one time in the transmission buffer with respect to the one request data. The wireless circuit unit is further configured to delete the battery information corresponding to the communication establishment from the transmission buffer, and hold the battery information corresponding to the communication failure in the transmission buffer based on the communication establishment information.

In the battery management system described above, the wireless circuit unit of the monitoring device includes the transmission buffer. Therefore, the battery information for multiple times can be accumulated in the transmission buffer. The battery information accumulated in the transmission buffer is deleted when communication with the control device is established, and is not deleted and is held in the transmission buffer when communication with the control device is not established. As a result, it is possible to suppress an omission of data including the battery information.

Hereinafter, multiple embodiments will be described with reference to the drawings. The same reference numerals are assigned to the corresponding elements in each embodiment, and thus, duplicate descriptions may be omitted. When a part of the features in each embodiment is explained, the remaining part of the features may be provided by the features in other preceding embodiments. Further, not only the combinations of the configurations explicitly shown in the description of the respective embodiments, but also the configurations of the multiple embodiments can be partially combined even when they are not explicitly shown as long as there is no difficulty in the combination in particular.

First Embodiment

First, based on FIG. 1, a vehicle equipped with a battery management system according to the present embodiment, particularly, a configuration around a battery pack provided with the battery management system will be described. FIG. 1 is a diagram showing a schematic configuration of the vehicle. The vehicle is an electric vehicle such as a battery electric vehicle or a hybrid electric vehicle.

<Vehicle>

As shown in FIG. 1, a vehicle 10 includes a battery pack (BAT) 11, a PCU 12, an MG 13, and an ECU 14. PCU is an abbreviation for Power Control Unit. MG is an abbreviation for Motor Generator. ECU is an abbreviation for Electronic Control Unit.

The battery pack 11 includes an assembled battery 20, which will be described later, and provides a DC voltage source that can be charged and discharged. The battery pack 11 supplies electric power to an electric load of the vehicle 10. The battery pack 11 supplies electric power to the MG 13 through the PCU 12. The battery pack 11 is charged through the PCU 12. The battery pack 11 may be referred to as a main battery.

The battery pack 11 is disposed in a front compartment of the vehicle 10, for example, as shown in FIG. 1. The battery pack 11 may be disposed in a rear compartment, under a seat, under a floor, and the like. For example, in the case of a hybrid electric vehicle, a compartment in which an engine is disposed may be referred to as an engine compartment or an engine room.

The PCU 12 executes bidirectional power conversion between the battery pack 11 and the MG 13 according to a control signal from the ECU 14. The PCU 12 may be referred to as a power converter. The PCU 12 includes, for example, an inverter. The inverter converts the DC voltage into an AC voltage, for example, a three-phase AC voltage, and outputs the AC voltage to the MG 13. The inverter converts the generated power of the MG 13 into a DC voltage and outputs the DC voltage to a converter. The PCU 12 may include the converter. The converter is arranged in an energization path between the battery pack 11 and the inverter. The converter has a function of raising and lowering the DC voltage.

The MG 13 is an AC rotating electric machine, for example, a three-phase AC synchronous motor in which a permanent magnet is embedded in a rotor. The MG 13 functions as a traveling drive source for the vehicle 10, that is, an electric motor. The MG 13 is driven by the PCU 12 to generate a rotational driving force. The driving force generated by the MG 13 is transmitted to driving wheels. The MG 13 functions as a generator when the vehicle 10 is braked, and performs regenerative power generation. The generated power of the MG 13 is supplied to the battery pack 11 through the PCU 12 and stored in the assembled battery 20 in the battery pack 11.

The ECU 14 includes a computer including a processor, a memory, an input/output interface, a bus connecting these components, and the like. The processor is a hardware for arithmetic processing. The processor includes, for example, a CPU as a core. CPU is an abbreviation for Central Processing Unit. The memory is a non-transitional substantive storage medium that non-temporarily stores programs and data readable by a computer. The memory stores various programs executed by the processor.

The ECU 14 acquires information about the assembled battery 20 from the battery pack 11, for example, and controls the PCU 12 to control the drive of the MG 13 and the charging and discharging of the battery pack 11. The ECU 14 may acquire information such as voltage, temperature, current, SOC, and SOH of the assembled battery 20 from the battery pack 11. The ECU 14 may acquire battery information such as voltage, temperature, and current of the assembled battery 20 to calculate SOC and SOH. SOC is an abbreviation for State Of Charge. SOH is an abbreviation for State Of Health.

The processor of the ECU 14 executes multiple instructions included in, for example, a PCU control program stored in the memory. Accordingly, the ECU 14 constructs multiple functional units for controlling the PCU 12. The ECU 14 constructs multiple functional units by causing the processor to execute the multiple instructions. The ECU 14 may be referred to as an EVECU.

<Battery Pack>

Figure 2:
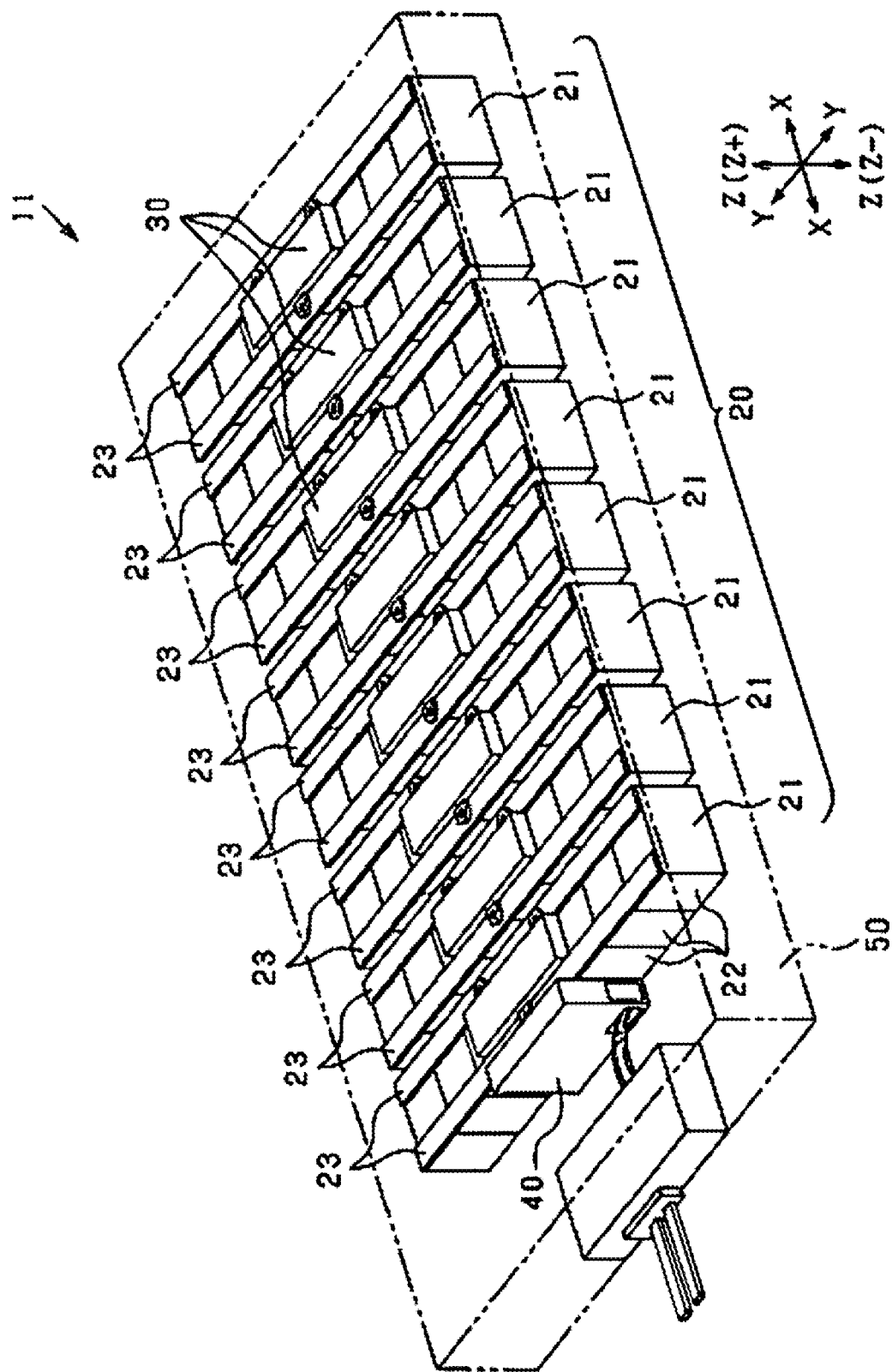
FIG. 2 is a perspective view showing a schematic configuration of the battery pack.
Figure 3:
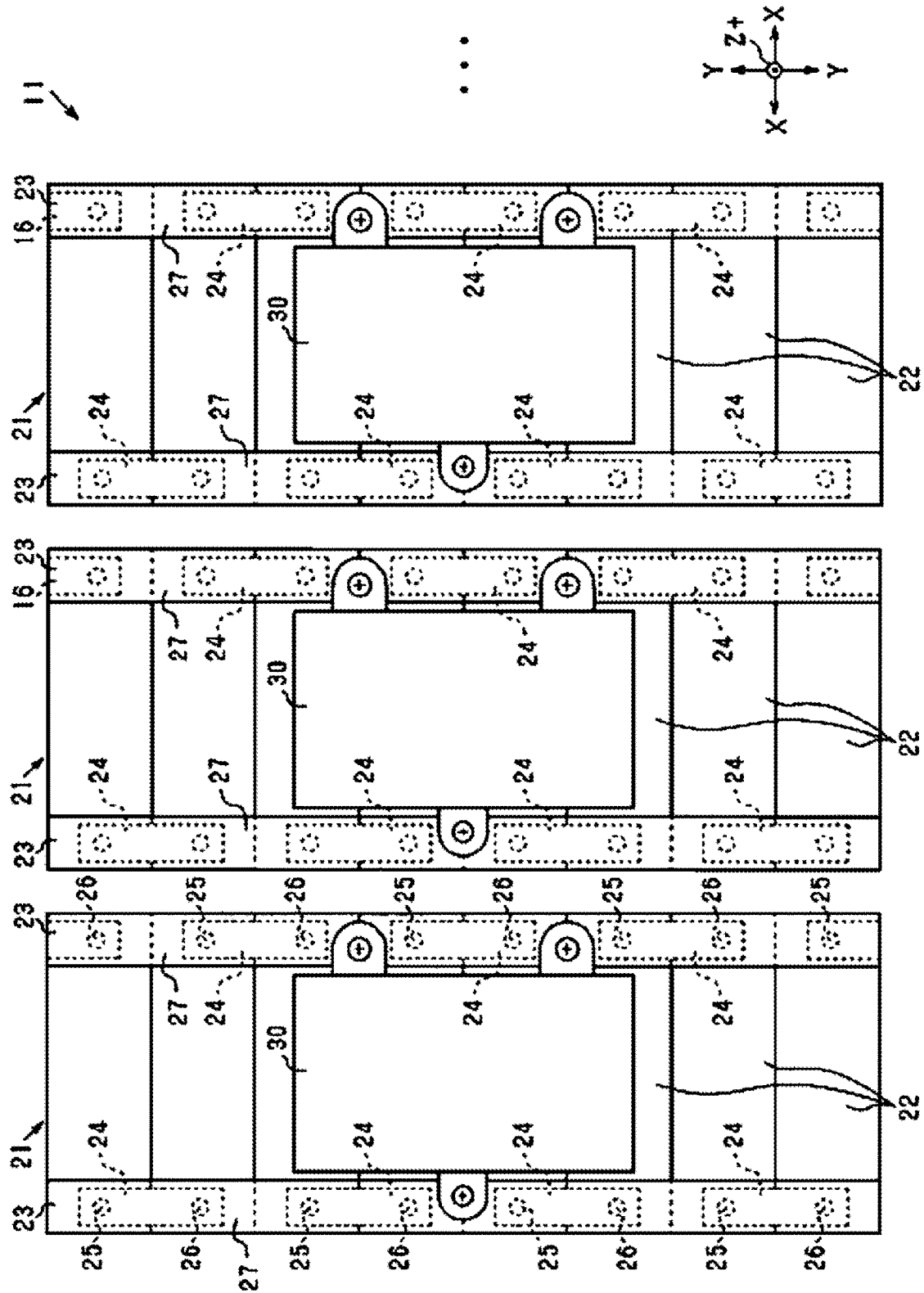
FIG. 3 is a plan view showing an assembled battery.

Next, an example of the configuration of the battery pack 11 will be described with reference to FIGS. 2 and 3. FIG. 2 is a perspective view schematically showing the inside of the battery pack 11. In FIG. 2, a housing is shown by a long dashed double-dotted line. FIG. 3 is a plan view showing an upper surface of each battery stack.

As shown in FIG. 2, the battery pack 11 includes the assembled battery 20, multiple monitoring devices 30, a control device 40, and a housing 50. The housing 50 houses other elements constituting the battery pack 11, that is, the assembled battery 20, the monitoring devices 30, and the control device 40.

In the following, as shown in FIG. 2, among the surfaces of the housing 50 which is a substantially rectangular parallelepiped, a longitudinal direction is indicated as an X direction and a lateral direction is indicated as a Y direction on a mounting surface on the vehicle 10. In FIG. 2, a lower surface is the mounting surface. A vertical direction perpendicular to the mounting surface is referred to as a Z direction. The X direction, the Y direction, and the Z direction are in a positional relationship orthogonal to each other. In the present embodiment, a left-right direction of the vehicle 10 corresponds to the X direction, a front-rear direction corresponds to the Y direction, and the vertical direction corresponds to the Z direction. The arrangement of FIGS. 2 and 3 is only an example, and the battery pack 11 may be arranged in any way with respect to the vehicle 10.

The assembled battery 20 includes multiple battery stacks 21 arranged side by side in the X direction. The battery stack 21 may be referred to as a battery block or a battery module. The assembled battery 20 is configured by connecting the multiple battery stacks 21 in series. Each of the battery stacks 21 includes multiple battery cells 22. Each of the battery stacks 21 includes the multiple battery cells 22 connected in series. The battery stack 21 of the present embodiment is configured by connecting the multiple battery cells 22 arranged side by side in the Y direction in series. The assembled battery 20 provides the above-mentioned DC voltage source. The assembled battery 20, the battery stacks 21, and the battery cells 22 correspond to a battery.

Each of the battery cells 22 is a secondary battery that generates an electromotive voltage by a chemical reaction. As the secondary battery, for example, a lithium ion secondary battery or a nickel hydrogen secondary battery can be adopted. The lithium ion secondary battery is a secondary battery using lithium as a charge carrier. In addition to a general lithium ion secondary battery having a liquid electrolyte, a so-called all-solid-state battery using a solid electrolyte can also be included.

On the upper surface of each of the battery stacks 21, linear bus bar units 23 are arranged at both ends in the X direction. That is, a pair of bus bar units 23 are arranged in each of the battery stacks 21. The bus bar units 23 electrically connect the multiple battery cells 22. As shown in FIG. 3, each of the battery cells 22 is formed in a flat shape and is laminated so that the side surfaces overlap each other in the Y direction. Each of the battery cells 22 has positive electrode terminals 25 and negative electrode terminals 26 protruding in the Z direction, more specifically in the Z+ direction indicating upward, at both ends in the X direction. The battery cells 22 are laminated so that the positive electrode terminals 25 and the negative electrode terminals 26 are alternately arranged in the Y direction.

Each of the bus bar units 23 includes multiple bus bars 24 that electrically connect the positive electrode terminals 25 and the negative electrode terminals 26, and multiple bus bar covers 27 that covers the multiple bus bars 24. Each of the bus bars 24 is a plate material made of a metal having good conductivity such as copper. Each of the bus bars 24 electrically connects the positive electrode terminal 25 and the negative electrode terminal 26 of the adjacent battery cells 22 in the Y direction. Accordingly, in each of the battery stacks 21, the multiple battery cells 22 are electrically connected in series. In each of the battery stacks 21, the positive electrode terminal 25 of the battery cell 22 arranged on one end side in the Y direction is connected to a predetermined positive electrode wiring, and the negative electrode terminal 26 of the battery cell 22 arranged on the other end side is connected to a predetermined negative electrode wiring.

Each of the bus bar covers 27 is formed by using an electrically insulating material such as resin. The bus bar cover 27 is provided linearly from one end to the other of the battery stack 21 along the Y direction so as to cover the multiple bus bars 24.

The monitoring devices 30 are individually provided for the battery stacks 21, respectively. As shown in FIG. 2, the monitoring device 30 is arranged between the pair of bus bar units 23 in each of the battery stacks 21. The monitoring device 30 is fixed to the bus bar unit 23 with screws or the like. As will be described later, the monitoring device 30 is configured to be capable of performing wireless communication with the control device 40. An antenna 37 included in the monitoring device 30 is arranged so as not to overlap the bus bar unit 23 in the Z direction, that is, to protrude from the bus bar unit 23 in the Z direction.

The control device 40 is attached to an outer surface of the battery stack 21 arranged at one end in the X direction. The control device 40 is configured to be capable of performing wireless communication with each of the monitoring devices 30. An antenna 42 included in the control device 40 is arranged at the same height as a radio antenna of the monitoring device 30 in the Z direction. That is, the antenna 42 of the control device 40 is provided so as to protrude from the bus bar units 23 in the Z direction.

In the battery pack 11, the monitoring devices 30 and the control device 40 provide a battery management system described later. That is, the battery pack 11 includes the battery management system.

<Battery Management System>

Figure 4:
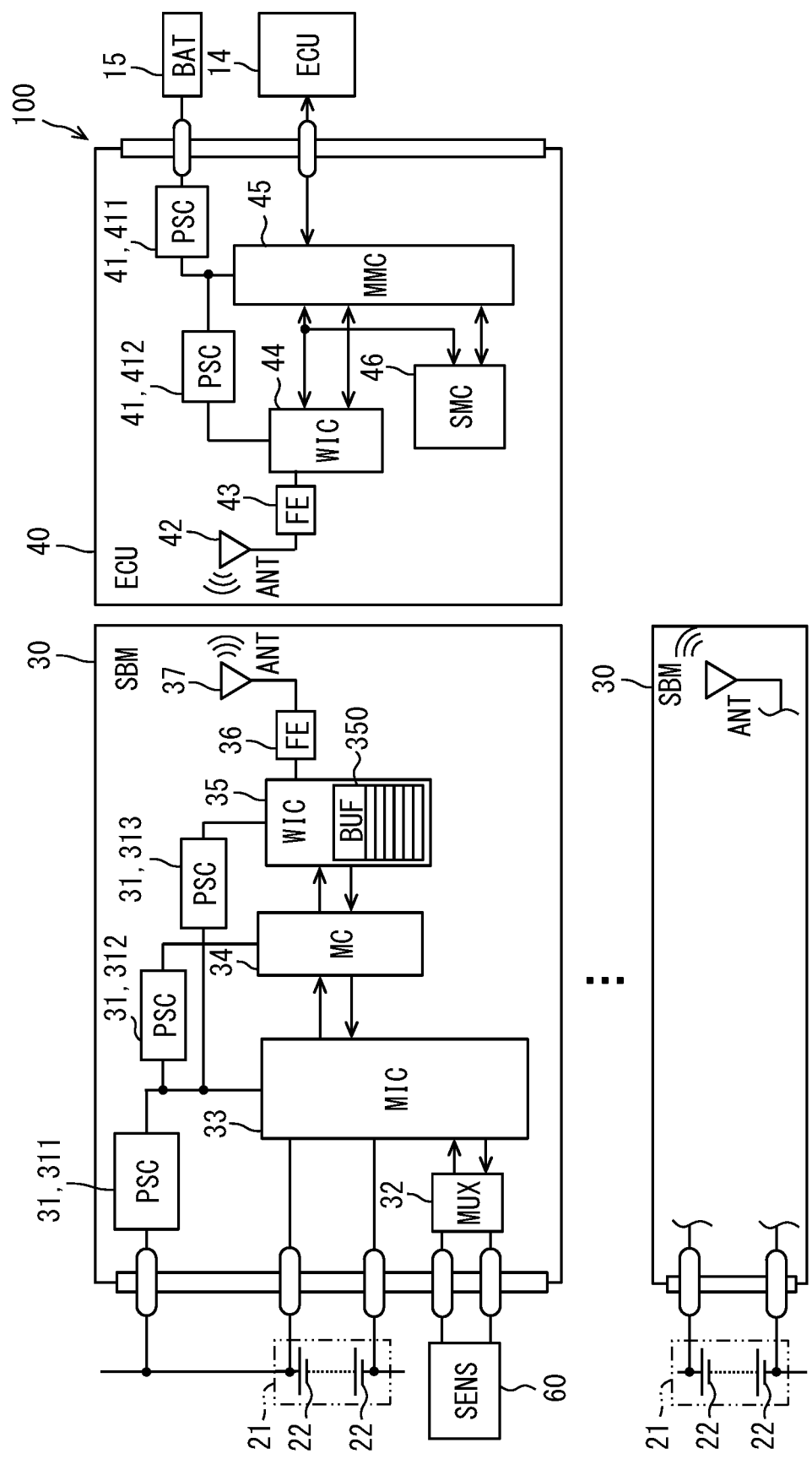
FIG. 4 is a block diagram showing a configuration of a battery management system according to a first embodiment.

Next, a schematic configuration of the battery management system will be described with reference to FIG. 4. FIG. 4 is a block diagram showing the configuration of the battery management system.

As shown in FIG. 4, the battery management system 100 includes the multiple monitoring devices (SBMs) 30 and the control device (ECU) 40. SBM is an abbreviation for Satellite Battery Module. The control device 40 may be referred to as a battery ECU or a BMU. BMU is an abbreviation for Battery Management Unit. The battery management system 100 is a system that manages batteries by using wireless communication. In the battery management system 100, wireless communication is executed between the one control device 40 and the multiple monitoring devices 30.

<Monitoring Device>

First, the monitoring devices 30 will be described. Since the configurations of the monitoring devices 30 are almost the same as each other, the common configuration will be described below. Each of the monitoring devices 30 includes a power supply circuit (PSC) 31, a multiplexer (MUX) 32, a monitoring IC (MIC) 33, a microcomputer (MC) 34, a wireless IC (WIC) 35, a front end circuit (FE) 36, and the antenna (ANT) 37. Communication between each element in each of the monitoring devices 30 is performed via wires. IC is an abbreviation for Integrated Circuit.

The power supply circuit 31 uses a voltage supplied from the battery stack 21 to generate an operating power source for other circuit elements included in the monitoring device 30. In the present embodiment, the power supply circuit 31 includes power supply circuits 311, 312, and 313. The power supply circuit 311 generates a predetermined voltage using the voltage supplied from the battery stack 21 and supplies the predetermined voltage to the monitoring IC 33. The power supply circuit 312 generates a predetermined voltage using the voltage generated by the power supply circuit 311 and supplies the predetermined voltage to the microcomputer 34. The power supply circuit 313 generates a predetermined voltage using the voltage generated by the power supply circuit 311 and supplies the predetermined voltage to the wireless IC 35.

The multiplexer 32 is a selection circuit that receives detection signals of multiple sensors 60 included in the battery pack 11 and outputs the detection signals as one signal. The multiplexer 32 selects (switches) an input according to a selection signal from the monitoring IC 33 and outputs it as one signal. The sensor 60 includes a sensor for detecting a physical quantity of each of the battery cells 22 and a sensor for discriminating each of the battery cells 22, for example. The sensor for detecting the physical quantity includes, for example, a voltage sensor, a temperature sensor, a current sensor, and the like.

The monitoring IC 33 senses (acquires) battery information such as cell voltage, cell temperature, and cell discrimination through the multiplexer 32, and transmits the battery information to the microcomputer 34. The monitoring IC 33 may be referred to as a CSC. CSC is an abbreviation for Cell Supervising Circuit. The monitoring IC 33 may have a function of executing a failure diagnosis of a circuit unit of the monitoring device 30 including the monitoring IC 33 and transmitting a diagnosis result together with the battery information as monitoring data. When the monitoring IC 33 receives the data requesting acquisition of the battery information transmitted from the microcomputer 34, the monitoring IC 33 senses the battery information through the multiplexer 32 and transmits the monitoring data including at least the battery information to the microcomputer 34. The monitoring IC 33 corresponds to a monitoring unit.

The microcomputer 34 is a microcomputer including a CPU as a processor, a ROM and a RAM as memories, an input/output interface, and a bus connecting these elements. The CPU constructs multiple functional units by executing various programs stored in the ROM while using a temporary storage function of the RAM. ROM is abbreviation for Read Only Memory. RAM is abbreviation for Random Access Memory.

The microcomputer 34 controls a schedule of sensing and self-diagnosis by the monitoring IC 33. The microcomputer 34 receives the monitoring data transmitted from the monitoring IC 33 and transmits it to the wireless IC 35. The microcomputer 34 transmits data requesting acquisition of the battery information to the monitoring IC 33. As an example, when the microcomputer 34 of the present embodiment receives the data requesting the acquisition of the battery information transmitted from the wireless IC 35, the microcomputer 34 transmits the data requesting the acquisition of the battery information to the monitoring IC 33.

The wireless IC 35 includes an RF circuit for transmitting and receiving data wirelessly. The wireless IC 35 may include a microcomputer in addition to the RF circuit. The wireless IC 35 has a transmission function of modulating transmission data and oscillating at the frequency of an RF signal. The wireless IC 35 has a reception function for demodulating received data. RF is an abbreviation for Radio Frequency.

The wireless IC 35 modulates the data including the monitoring information transmitted from the microcomputer 34 and transmits it to the control device 40 via the front end circuit 36 and the antenna 37. The wireless IC 35 adds data necessary for wireless communication such as communication control information to transmission data including the battery information and transmits the transmission data. The data required for wireless communication includes, for example, an identifier (ID), an error detection code, and the like. The wireless IC 35 controls the data size, communication format, schedule, error detection, and the like of the communication between the monitoring device 30 and the control device 40.

The wireless IC 35 receives the data transmitted from the control device 40 via the antenna 37 and the front end circuit 36, and demodulates the data. For example, when the wireless IC 35 receives data including a transmission request of the battery information, the wireless IC 35 transmits the data including the battery information to the control device 40 as a response to the request. As an example, when the wireless IC 35 of the present embodiment receives data including an acquisition request of the battery information, the wireless IC 35 transmits the data (information) related to the acquisition request to the microcomputer 34. The wireless IC 35 corresponds to a wireless circuit unit.

The wireless IC 35 has a transmission buffer (BUF) 350 for accumulating the battery information. The transmission buffer 350 temporarily holds the monitoring data including the battery information. The transmission buffer 350 is configured to be capable of accumulating the monitoring data for multiple times, that is, the battery information acquired by the monitoring IC 33 multiple times. The transmission buffer 350 of the present embodiment is a hardware circuit configured in the RF circuit. In a configuration in which the wireless IC 35 includes a microcomputer, the transmission buffer 350 may be configured on a software. When the wireless IC 35 receives communication establishment information transmitted by the control device 40, the wireless IC 35 deletes the monitoring data for which communication is established from the transmission buffer 350.

The front end circuit 36 has a matching circuit for impedance matching between the wireless IC 35 and the antenna 37, and a filter circuit for removing unnecessary frequency components.

The antenna 37 converts an RF signal, which is an electric signal, into a radio wave and radiates it into space. The antenna 37 receives a radio wave propagating in space and converts it into an electrical signal.

<Control Device>

Next, the control device 40 will be described. The control device 40 includes a power supply circuit (PSC) 41, an antenna (ANT) 42, a front end circuit (FE) 43, a wireless IC (WIC) 44, a main microcomputer (MMC) 45, and a sub microcomputer (SMC) 46. Communication between each element in the control device 40 is performed via wires.

The power supply circuit 41 uses a voltage supplied from a battery (BAT) 15 to generate an operating power source for other circuit elements included in the control device 40. The battery 15 is a DC voltage source mounted on the vehicle 10 and different from the battery pack 11. The battery 15 may be referred to as an auxiliary battery since the battery 15 supplies electric power to an auxiliary equipment of the vehicle 10. In the present embodiment, the power supply circuit 41 includes power supply circuits 411 and 412. The power supply circuit 411 generates a predetermined voltage using the voltage supplied from the battery 15, and supplies the predetermined voltage to the main microcomputer 45 and the sub microcomputer 46. For the sake of simplification of the figure, the electrical connection between the power supply circuit 411 and the sub microcomputer 46 is omitted. The power supply circuit 412 generates a predetermined voltage using the voltage generated by the power supply circuit 411 and supplies the predetermined voltage to the wireless IC 44.

The antenna 42 converts an RF signal, which is an electric signal, into a radio wave and radiates it into space. The antenna 37 receives a radio wave propagating in space and converts it into an electrical signal.

The front end circuit 43 has a matching circuit for impedance matching between the wireless IC 44 and the antenna 42, and a filter circuit for removing unnecessary frequency components.

The wireless IC 44 has an RF circuit for transmitting and receiving data wirelessly. The wireless IC 44 has the same configuration as the wireless IC 35. The wireless IC 44 has a transmission function and a reception function. The wireless IC 44 receives the data transmitted from the monitoring device 30 via the antenna 42 and the front end circuit 43, and demodulates the data. Then, the wireless IC 44 transmits the monitoring data including the battery information to the main microcomputer 45. The wireless IC 44 receives the data transmitted from the main microcomputer 45, modulates the data, and transmits the modulated data to the monitoring device 30 via the front end circuit 43 and the antenna 42. The wireless IC 44 adds data necessary for wireless communication such as communication control information to the transmission data and transmits the data. The data required for wireless communication includes, for example, an identifier (ID), an error detection code, and the like. The wireless IC 44 controls the data size, communication format, schedule, error detection, and the like of communication between the monitoring device 30 and the control device 40.

The main microcomputer 45 is a microcomputer including a CPU, a ROM, a RAM, an input/output interface, a bus connecting these elements, and the like. The ROM stores various programs executed by the CPU. The main microcomputer 45 generates a command that requests the monitoring device 30 to execute processing, and transmits transmission data including the command to the wireless IC 44.

The main microcomputer 45 generates, for example, a transmission request command that requests transmission of the monitoring data including the battery information. The main microcomputer 45 can make the transmission data include an acquisition request command that requests acquisition of the monitoring data in addition to the transmission request command. The main microcomputer 45 can make the transmission data include communication establishment information indicating whether or not wireless communication with the monitoring device 30 is normally performed in addition to the transmission request command.

The main microcomputer 45 receives the monitoring data including the battery information transmitted from the wireless IC 44, and executes a predetermined process based on the monitoring data. For example, the main microcomputer 45 executes a process of transmitting the acquired battery information to the ECU 14. The main microcomputer 45 may calculate SOC and/or SOH based on the battery information, and may transmit the calculated battery information including the SOC and/or SOH to the ECU 14. The main microcomputer 45 may execute an equalization process for equalizing the voltage of each of the battery cells 22 based on the battery information. The main microcomputer 45 may acquire an ignition (IG) signal of the vehicle 10 and execute the above-described process according to a driving state of the vehicle 10 based on the IG signal. The main microcomputer 45 may execute a process of detecting an abnormality in the battery cell 22 based on the battery information, or may transmit an abnormality detection information to the ECU 14.

The sub microcomputer 46 is a microcomputer provided including a CPU, a ROM, a RAM, an input/output interface, a bus connecting these elements, and the like. The ROM stores various programs executed by the CPU. The sub microcomputer 46 executes the monitoring process in the control device 40. For example, the sub microcomputer 46 may monitor data between the wireless IC 44 and the main microcomputer 45. The sub microcomputer 46 may monitor the state of the main microcomputer 45. The sub microcomputer 46 may monitor the state of the wireless IC 44.

<Transmission and Reception of Battery Information>

Figure 5:
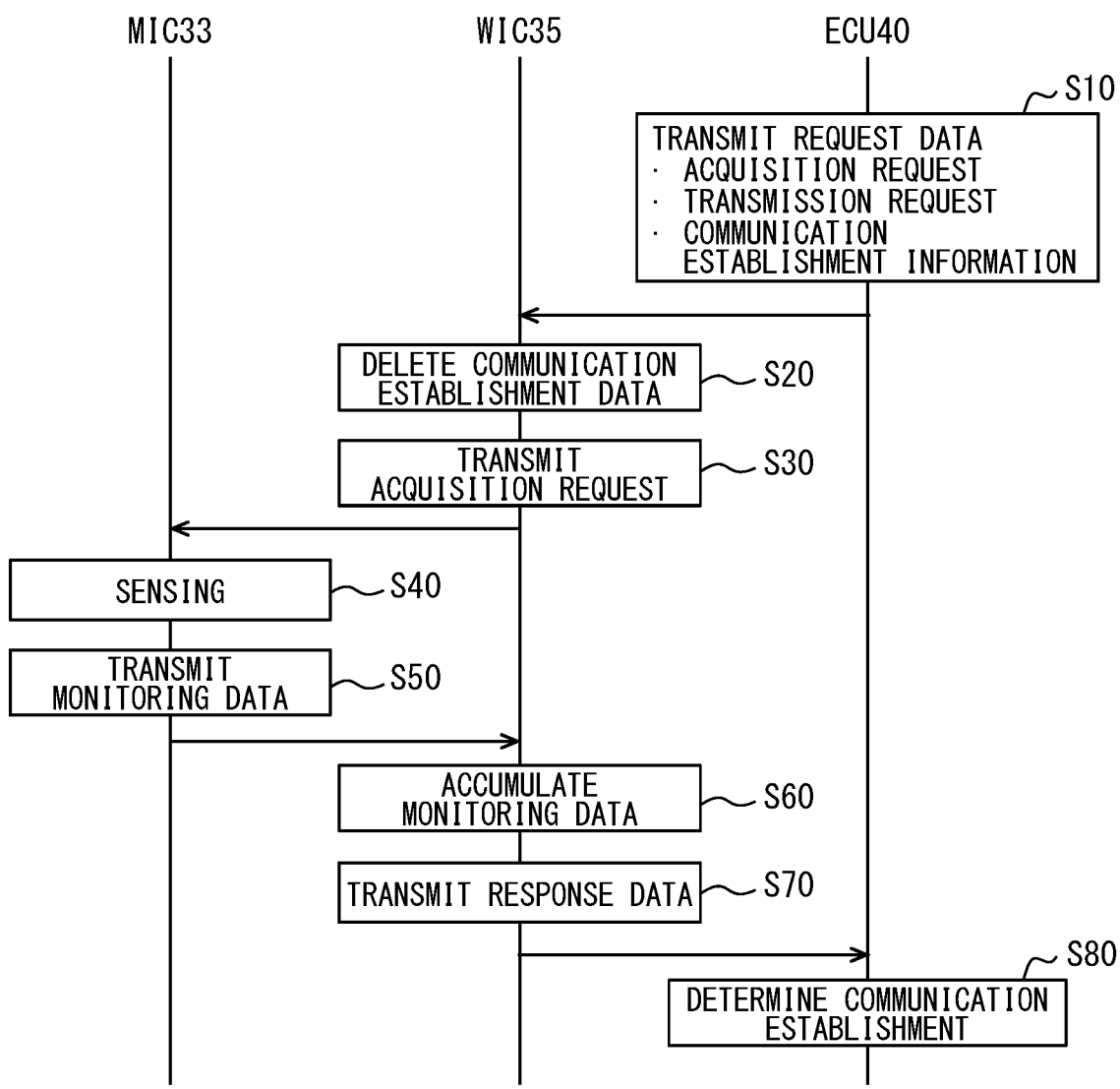
FIG. 5 is a diagram showing a sequence of requests and responses of battery information.

Next, the transmission and reception of the battery information between the control device 40 and one of the monitoring devices 30 will be described with reference to FIG. 5. FIG. 5 shows an example of a sequence of requests and responses of the battery information. In FIG. 5, the monitoring IC 33 is shown as MIC 33, the wireless IC 35 is shown as WIC 35, and the control device 40 is shown as ECU 40.

As shown in FIG. 5, the control device 40 transmits the request data including the acquisition request and the transmission request of the monitoring data including the battery information to the monitoring device 30 (S10). The transmission data of S10 corresponds to a periodic data transmitted in a predetermined cycle among the request data. Requests may be referred to as instructions. The request data to be transmitted also includes communication establishment information indicating whether or not the control device 40 has normally received the response data including the battery information in the previous transmission and reception, that is, the previous request and response. For example, in the case of the first transmission and reception after the power source is turned on, the communication establishment information may indicate communication failure. Since all the data in the transmission buffer 350 is deleted by turning off the power source, the communication establishment information may indicate communication establishment.

When the wireless IC 35 of the monitoring device 30 receives the request data, if the communication establishment information indicates that the communication has been established, the communication establishment data, that is, the previous monitoring data is deleted from the transmission buffer 350 (S20). The deletion of the previous monitoring data is executed only when the communication has been established. If the communication has not been established, the previous monitoring data is not deleted from the transmission buffer 350 and is held.

Next, the wireless IC 35 transmits the acquisition request of the monitoring data including the battery information to the monitoring IC 33 (S30). In the present embodiment, the wireless IC 35 transmits the acquisition request to the monitoring IC 33 via the microcomputer 34.

Upon receiving the acquisition request, the monitoring IC 33 executes sensing (S40). The monitoring IC 33 executes sensing and acquires the battery information of each of the battery cells 22 through the multiplexer 32. Further, the monitoring IC 33 executes the failure diagnosis of the circuit portion.

Then, the monitoring IC 33 transmits the monitoring data including the battery information to the wireless IC 35 (S50). In the present embodiment, the monitoring data including the failure diagnosis result as well as the battery information is transmitted. The monitoring IC 33 transmits the monitoring data to the wireless IC 35 via the microcomputer 34.

When the wireless IC 35 receives the monitoring data acquired by the monitoring IC 33, the wireless IC 35 accumulates the monitoring data in the transmission buffer 350 (S60). Then, the wireless IC 35 transmits the transmission data including the monitoring data for one time among the monitoring data accumulated in the transmission buffer 350 to the control device 40 as response data (S70). The wireless IC 35 transmits the monitoring data accumulated in the transmission buffer 350 in chronological order, for example. When the previous monitoring data is not accumulated in the transmission buffer 350, the wireless IC 35 transmits the data acquired in S60, that is, the monitoring data acquired this time to the control device 40.

The control device 40 determines the establishment of communication after executing the process of S10 (S80). The control device 40 determines whether or not the monitoring data including the battery information has been normally received within one cycle of transmission and reception, and reflects this determination result in the communication establishment information to be transmitted next time.

The communication establishment information is information capable of distinguishing between communication establishment in which the control device 40 has normally received the monitoring data and communication failure in which the control device 40 has not normally received the monitoring data. The control device 40 determines that the communication is failed, for example, when the monitoring data including the battery information cannot be received within one cycle. The control device 40 may determine that the communication is failed when the monitoring data cannot be received within a predetermined time shorter than one cycle. For example, the control device 40 may perform a time-out check by including a sequence number in the request data to be transmitted and requesting a return of the sequence number by the response data. Further, the control device 40 may also determine that the communication is failed even when a communication error is detected by an inspection executed at the time of reception, although the monitoring data can be received. When the control device 40 receives the data, the control device 40 performs the inspection using, for example, an error detection code. The communication establishment information may include information indicating communication establishment and/or information indicating communication failure. Even when one of the information indicating communication establishment and the information indicating communication failure is included, the wireless IC 35 can determine whether or not the previous communication is established.

The battery management system 100 repeatedly executes the above-described processes S10 to S80 at the predetermined cycle.

Summary of First Embodiment

According to the battery management system 100 of the present embodiment, the wireless IC 35 of the monitoring device 30 includes the transmission buffer 350. The transmission buffer 350 can accumulate monitoring data for multiple times acquired by the monitoring IC 33 of the monitoring device 30, that is, the battery information for multiple times. The monitoring data accumulated in the transmission buffer 350 is deleted when the communication with the control device 40 has been normally performed based on the communication establishment information from the control device 40. On the other hand, when the communication has not been performed normally, the monitoring data is not deleted but is held in the transmission buffer 350 and retransmitted. As a result, it is possible to suppress an omission of data including the battery information.

In a case of wireless communication, the communication speed is slower than that of wired communication, and the communication frequency is often low. Therefore, in a case where an abnormality occurs in at least one of the physical quantities such as a voltage of the battery cell 22, or in a case where an abnormality is detected by the failure diagnosis information, when an omission of the monitoring data occurs, a value may be changed suddenly. If the value is changed suddenly, the control will be changed suddenly, and although there is no problem in safety, there is a risk that operability will be affected. On the other hand, according to the present embodiment, the control device 40 determines whether a communication error occurs in response to receiving voltage data included in the response data, and requests the wireless IC 35 to retransmit the voltage data when determining that the communication errors occurs. Therefore, it is possible to suppress the omission of the monitoring data indicating an abnormality and suppress the influence on the operability.

Further, by suppressing the omission of the monitoring data, it is possible to accurately estimate an element estimated by the accumulation of the monitoring data, for example, the accumulation of a battery damage. In addition, the detection of abnormalities may be performed the number of times exceeding the threshold value. Also in the present case, by suppressing the omission of the monitoring data, it is possible to accelerate the detection timing of abnormalities.

Figure 6:
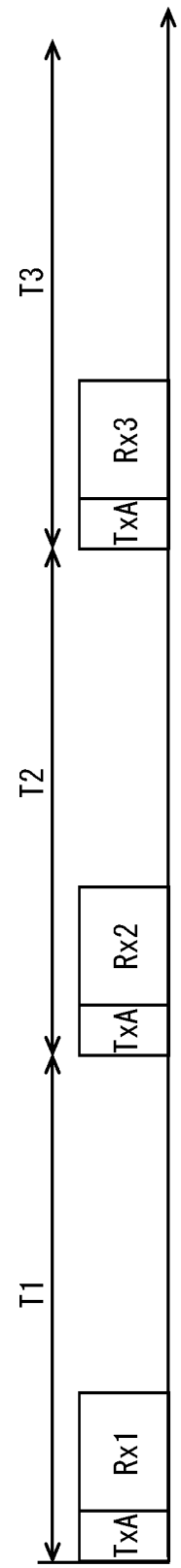
FIG. 6 is a timing chart showing an example of requests and responses.
Figure 7:
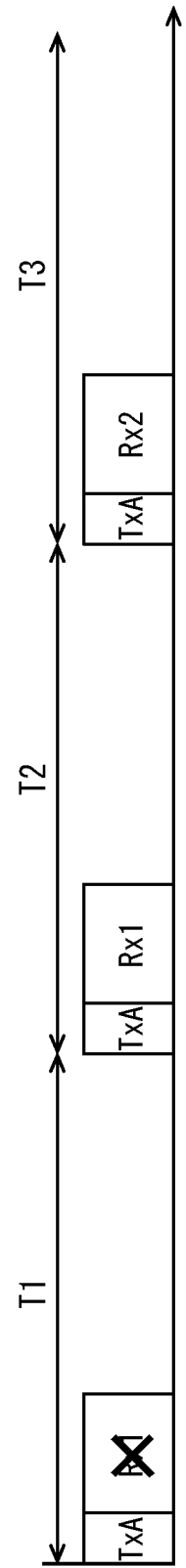
FIG. 7 is a timing chart showing another example of requests and responses.

FIGS. 6 and 7 are timing charts showing examples of the transmission and reception, that is, requests and responses in the battery management system 100 according to the present embodiment. FIG. 6 shows an example in which the transmission and reception is normally performed over multiple cycles. FIG. 7 shows an example in which the transmission and reception is not performed normally.

Each of T1, T2, and T3 shown in FIGS. 6 and 7 indicates one cycle of transmission and reception. TxA indicates the request data transmitted from the control device 40 to the monitoring device 30. TxA corresponds to periodic data. Rx indicates the monitoring data among the response data transmitted from the monitoring device 30 to the control device 40. The number added to Rx indicates the number of times (cycles) the monitoring data is acquired by the monitoring IC 33. For example, Rx1 is the monitoring data acquired in the first period T1. In the following, it is assumed that the monitoring data is not accumulated in the transmission buffer 350 at a stage of executing the process of the first cycle T1.

When the communication has been performed normally, the previous monitoring data accumulated in the transmission buffer 350 is deleted by the communication establishment information included in the data TxA. Therefore, as shown in FIG. 6, when the communication establishment continues, the acquired monitoring data can be transmitted to the control device 40 as the response signal within the cycle. That is, the monitoring data including the latest acquired battery information can be transmitted to the control device 40. The control device 40 can execute processes based on the latest monitoring data.

In the example shown in FIG. 7, in the first cycle T1, the control device 40 cannot normally receive the data Rx1. Therefore, in the second cycle T2, the communication establishment information included in the data TxA indicates communication failure. As a result, the data Rx1 in the transmission buffer 350 is held and transmitted as the response data in the second period T2. The data Rx2 acquired in the second cycle T2 is not transmitted in the second cycle T2, but is held in the transmission buffer 350. In the second cycle T2, the control device 40 normally receives the data Rx1. Therefore, the data Rx2 is transmitted in the third period T3. In this way, the data for which communication is not established can be transmitted again without being deleted. That is, it is possible to suppress the omission of data including the battery information.

In the present embodiment, the control device 40 requests the acquisition and transmission of the monitoring data including the battery information, and the monitoring IC 33 acquires and transmits the monitoring data accordingly. This eliminates the need for the monitoring IC 33 to manage and grasp the communication schedule. Further, by centrally managing the communication schedule by the control device 40, it becomes possible to easily manage and change the communication schedule. Moreover, the control in the monitoring IC 33 can be simplified.

In the present embodiment, an example has been described in which the monitoring data acquired by the monitoring IC 33 is accumulated in the transmission buffer 350 after the previous data of communication establishment is deleted from the transmission buffer 350. However, after accumulating the acquired monitoring data in the transmission buffer 350, the previous data of communication establishment may be deleted from the transmission buffer 350. It is sufficient that the previous data of communication establishment is deleted and the monitoring data acquired this time is accumulated before executing the data transmission process of S70.

Second Embodiment

The second embodiment is a modification of the preceding embodiment as a basic configuration and may incorporate description of the preceding embodiment. In the prior embodiment, an example has been described in which the process of request and response of the monitoring data is executed only once in one cycle. Alternatively, the process of request and response may be performed multiple times depending on the accumulated data in the transmission buffer 350.

Figure 8:
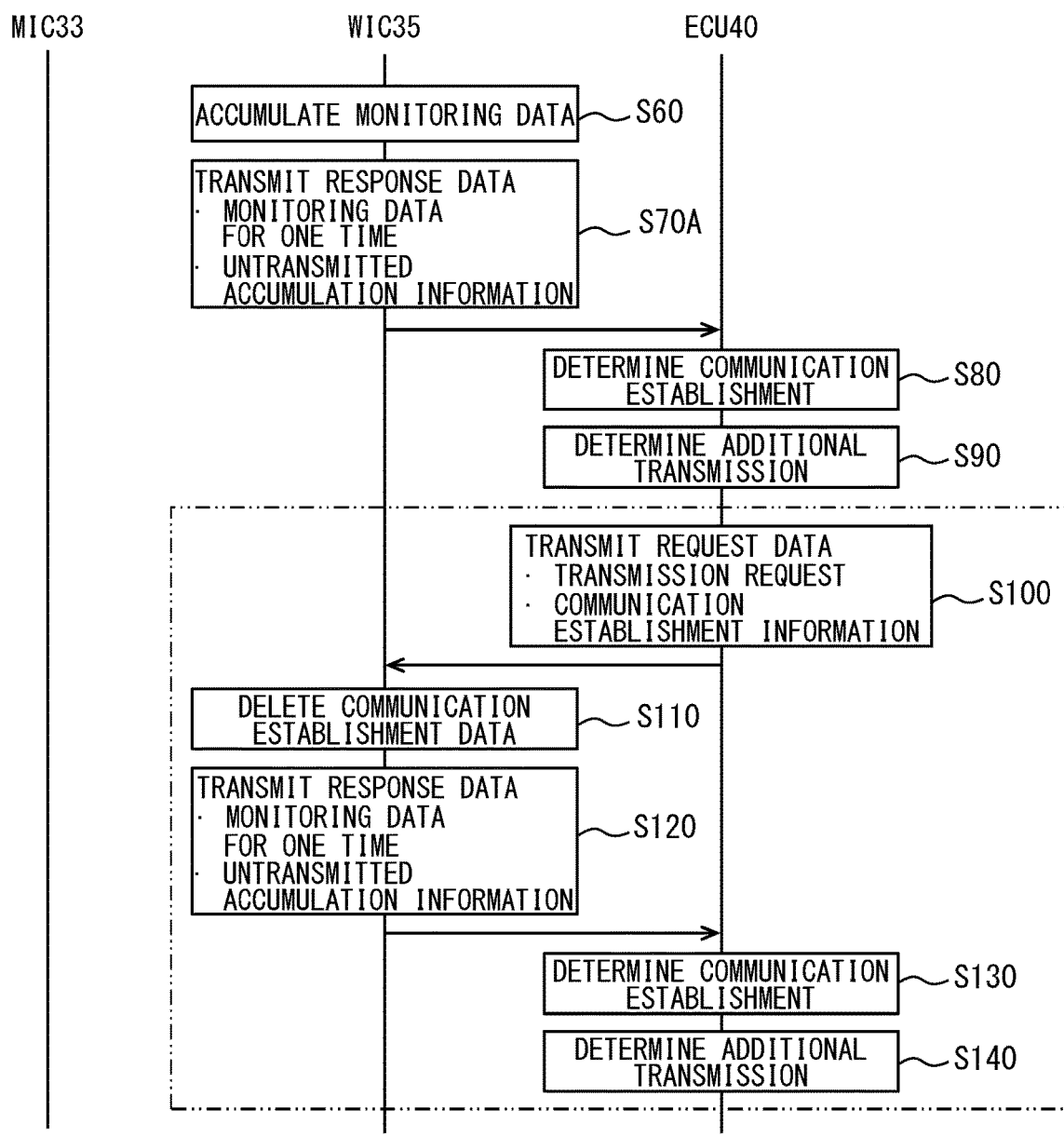
FIG. 8 is a diagram showing an example of a sequence of requests and responses of battery information in a battery management system according to a second embodiment.

FIG. 8 shows an example of a sequence of requests and responses of the battery information in the battery management system 100 according to the present embodiment. FIG. 8 corresponds to FIG. 5. The processes up to S60 are the same as those of the preceding embodiment. Therefore, the description of S10 to S50 is omitted, and the processes are shown from S60.

As shown in FIG. 8, the wireless IC 35 executes the process of S60, that is, the process of accumulating the monitoring data acquired by the monitoring IC 33 in the transmission buffer 350, and then executes the process of S70A. In S70A, instead of the process of the S70 described in the preceding embodiment, untransmitted accumulation information is transmitted together with the monitoring data for one time accumulated in the transmission buffer 350. The untransmitted accumulation information is information about the monitoring data that is accumulated in the transmission buffer 350 and is different from the monitoring data transmitted in S70A, and that has not been transmitted in this transmission and reception cycle. For example, the number of untransmitted monitoring data may be used, or an identifier that identifies untransmitted monitoring data may be used. The battery information included in the monitoring data transmitted in the process of S70A corresponds to first battery information. The battery information included in the untransmitted monitoring data corresponds to second battery information.

After the execution of S70A, the control device 40 executes the process of S80, that is, the communication establishment determination, as in the preceding embodiment.

The control device 40 executes a determination of an additional transmission process based on the untransmitted accumulation information in the received response data (S90). The control device 40 determines whether or not an additional transmission and reception process is possible based on, for example, the presence or absence of untransmitted data and the remaining time of the transmission and reception cycle, and if it is determined that the additional transmission and reception process is possible, the control device 40 executes the process of S100. If it is determined that the additional transmission and reception process is impossible, the process of S100 is not executed, and the process of S10 is executed in the next cycle.

In S100, the control device 40 executes a process excluding the acquisition request of the monitoring data from the process of S10. That is, the request data including the transmission request of the monitoring data and the communication establishment information is transmitted. The request data transmitted in the process of S10 corresponds to a first request data. The request data transmitted in the process of S100 corresponds to a second request data.

Upon receiving the request data processed by S100, the wireless IC 35 of the monitoring device 30 executes the process of S110. S110 is the same process as S20. In S110, when the communication establishment information indicates that the communication has been established, the wireless IC 35 deletes the previous monitoring data for which the communication has been established from the transmission buffer 350.

Since the received request data does not include the acquisition request, the same processes as in S30 to S60 are not executed in the additional transmission and reception process. When the process of S110 is completed, the wireless IC 35 executes the process of S120. S120 is the same process as 570A.

After the execution of S120, the control device 40 executes the process of S130 and the process of S140. S130 is the same process as S80, and S140 is the same process as S90. The processes surrounded by a long dashed double-dotted line shown in FIG. 8, that is, the processes from S100 to S140 correspond to the additional transmission and reception process. In S140, when the control device 40 determines that the additional transmission and reception process is possible, the control device 40 executes the additional transmission and reception process again. As described above, when there is untransmitted monitoring data in the transmission buffer 350 and transmission and reception within the cycle is possible, the additional transmission and reception process is repeatedly executed.

The wireless IC 35 may manage a flag of the transmission buffer 350, for example, in the above processes. The wireless IC 35 sets the flag to 1 when the monitoring data accumulated in the transmission buffer is transmitted. When communication is established in this state, the corresponding monitoring data is deleted from the transmission buffer 350. On the other hand, when communication is failed, the flag for the corresponding monitoring data is reset to 0. As a result, in a case of communication failure, the monitoring data is not deleted and is held. This method can be applied to the preceding embodiment.

When the monitoring data for multiple times are accumulated, the transmission buffer 350 performs the monitoring data transmission process in the order of acquisition, for example. The transmission buffer 350 shifts the operation position by one when executing additional transmission (S120) within one cycle. Accordingly, when the communication for the monitoring data that has been transmitted first is failed, the monitoring data is held without being deleted and another monitoring data can be transmitted within one cycle.

Summary of Second Embodiment

In the present embodiment, when the wireless IC 35 transmits the monitoring data (battery information) accumulated in the transmission buffer 350 in response to the request data (first request data) from the control device 40, the wireless IC 35 makes the response data include untransmitted accumulation information of untransmitted battery information (second battery information), which is different from the battery information (first battery information) to be transmitted. When the control device 40 receives the response data including the untransmitted accumulation information, the control device 40 transmits the request data (second request data) requesting the transmission of the untransmitted battery information to the monitoring device 30 within the same cycle as the first request data. That is, when there is remaining data in the transmission buffer 350, the additional transmission and reception process is executed. As a result, it is possible to suppress the delay in the transmission of the latest monitoring data while suppressing the omission of the monitoring data as in the preceding embodiment.

For example, it is preferable to use the latest battery information for charge and discharge control of the assembled battery 20 and control of the PCU 12 and the MG 13. According to the present embodiment, it is possible to improve the estimation accuracy such as the accumulation of battery damage, which is affected by the omission of the monitoring data, and improve the accuracy of various controls in which the latest monitoring data is important.

Figure 9:
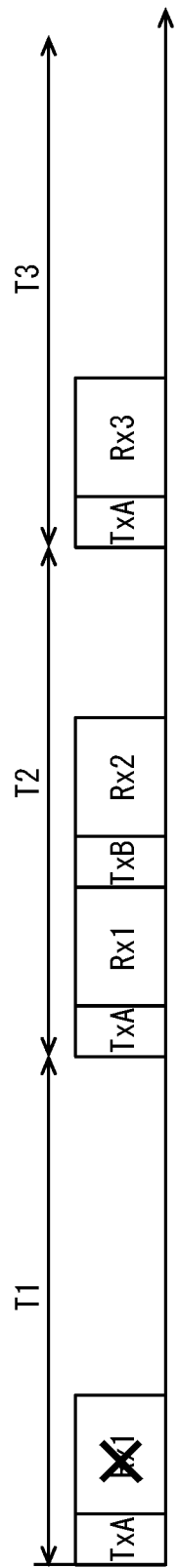
FIG. 9 is a timing chart showing an example of requests and responses.
Figure 10:
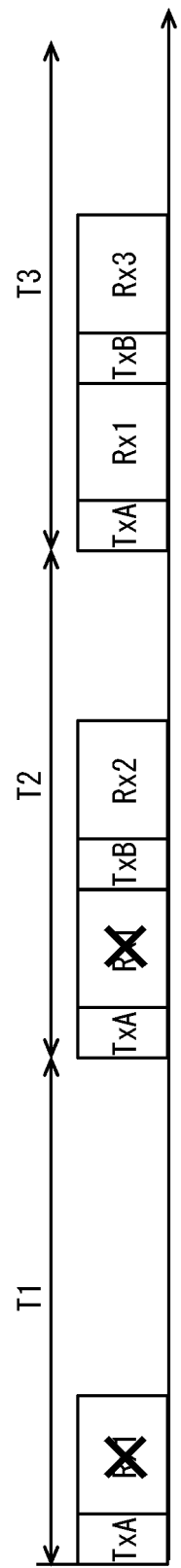
FIG. 10 is a timing chart showing another example of requests and responses.

FIGS. 9 and 10 are timing charts showing example of requests and responses in the battery management system 100 according to the present embodiment. FIGS. 9 and 10 correspond to FIGS. 6 and 7 described above. TxA indicates the first request data, and TxB indicates the second request data (additional request data). TxA corresponds to the periodic data. Also in these examples, it is assumed that no data has been accumulated in the transmission buffer 350 at the stage of executing the process of the first period T1.

FIG. 9 shows an example in which the control device 40 cannot receive the data Rx1 transmitted by the monitoring device 30 in the first cycle T1. The control device 40 cannot receive the untransmitted accumulation information. In the second cycle T2, the communication establishment information included in the data TxA indicates communication failure. Therefore, when the monitoring device 30 receives the data TxA, the monitoring device 30 holds the data Rx1 accumulated in the transmission buffer 350 without deleting. The monitoring device 30 transmits the data Rx1 from the transmission buffer 350 as the response data in the second cycle T2. The data Rx2 acquired in the second cycle T2 is not transmitted and is held in the transmission buffer 350. Therefore, the response signal includes the data Rx1 and the untransmitted accumulation information indicating that there is untransmitted data.

In the second cycle T2, the control device 40 normally receives the data Rx1. Since there is untransmitted monitoring data, the control device 40 transmits the data TxB including the additional transmission request. When the monitoring device 30 receives the data TxB, the monitoring device 30 deletes the data Rx1 accumulated in the transmission buffer 350 based on the communication establishment information included in the data TxB. Further, the monitoring device 30 transmits the data Rx2 from the transmission buffer 350. The response signal includes the data Rx2 and the untransmitted accumulation information indicating that there is no untransmitted data.

In the second cycle T2, the control device 40 normally receives the data Rx2. Since there is no untransmitted data, the control device 40 does not execute the additional transmission request. In the third cycle T3, the communication establishment information included in the data TxA indicates the communication establishment of the data Rx2. When the monitoring device 30 receives the data TxA, the monitoring device 30 deletes the data Rx2 accumulated in the transmission buffer 350 based on the communication establishment information. Further, the monitoring device 30 transmits the acquired data Rx3 from the transmission buffer 350.

FIG. 10 shows an example in which the control device 40 cannot receive the data Rx1 in the first cycle T1 and detects a communication error by inspection while receiving the data Rx1 in the second cycle T2. In the second cycle T2, the flow until the monitoring device 30 retransmits the data Rx1 is the same as that in FIG. 9, so the description thereof is omitted. The data Rx1 is transmitted with the untransmitted accumulation information indicating that there is untransmitted data.

In the second cycle T2, the control device 40 receives the data Rx1, but detects the communication error by inspection using an error correction code or the like. Since there is untransmitted data, the control device 40 transmits the data TxB including the additional transmission request. The data TxB includes communication establishment information indicating communication failure. When the monitoring device 30 receives the data TxB, the monitoring device 30 holds the data Rx1 accumulated in the transmission buffer 350 without deleting the data Rx1 based on the communication establishment information included in the data TxB. Further, the monitoring device 30 transmits the data Rx2 from the transmission buffer 350. The response signal includes the data Rx2 and the untransmitted accumulation information indicating that there is no untransmitted data.

In the second cycle T2, the control device 40 normally receives the data Rx2. Since there is no untransmitted data, the control device 40 does not execute the additional transmission request. In the third cycle T3, the communication establishment information included in the data TxA indicates the communication establishment of the data Rx2. When the monitoring device 30 receives the data TxA, the monitoring device 30 deletes the data Rx2 accumulated in the transmission buffer 350 based on the communication establishment information. The monitoring device 30 transmits the data Rx1 from the transmission buffer 350 as the response data in the third period T3. The data Rx3 acquired in the third period T3 is not transmitted and is held in the transmission buffer 350. The response signal includes the data Rx1 and the untransmitted accumulation information indicating that there is untransmitted data.

In the third period T3, the control device 40 normally receives the data Rx1. Since there is untransmitted data, the control device 40 transmits the data TxB including the additional transmission request. When the monitoring device 30 receives the data TxB, the monitoring device 30 deletes the data Rx1 accumulated in the transmission buffer 350 based on the communication establishment information included in the data TxB. Further, the monitoring device 30 transmits the data Rx3 from the transmission buffer 350. The response signal includes the data Rx3 and the untransmitted accumulation information indicating that there is no untransmitted data.

As can be seen from the examples shown in FIGS. 9 and 10, according to the present embodiment, it is possible to suppress the delay in the transmission of the latest monitoring data while suppressing the omission of the monitoring data.

Third Embodiment

The third embodiment is a modification of the preceding embodiments as a basic configuration and may incorporate description of the preceding embodiments. Although not specifically mentioned in the preceding embodiments, all the data accumulated in the transmission buffer 350 may be deleted when a predetermined condition is satisfied.

Figure 11:
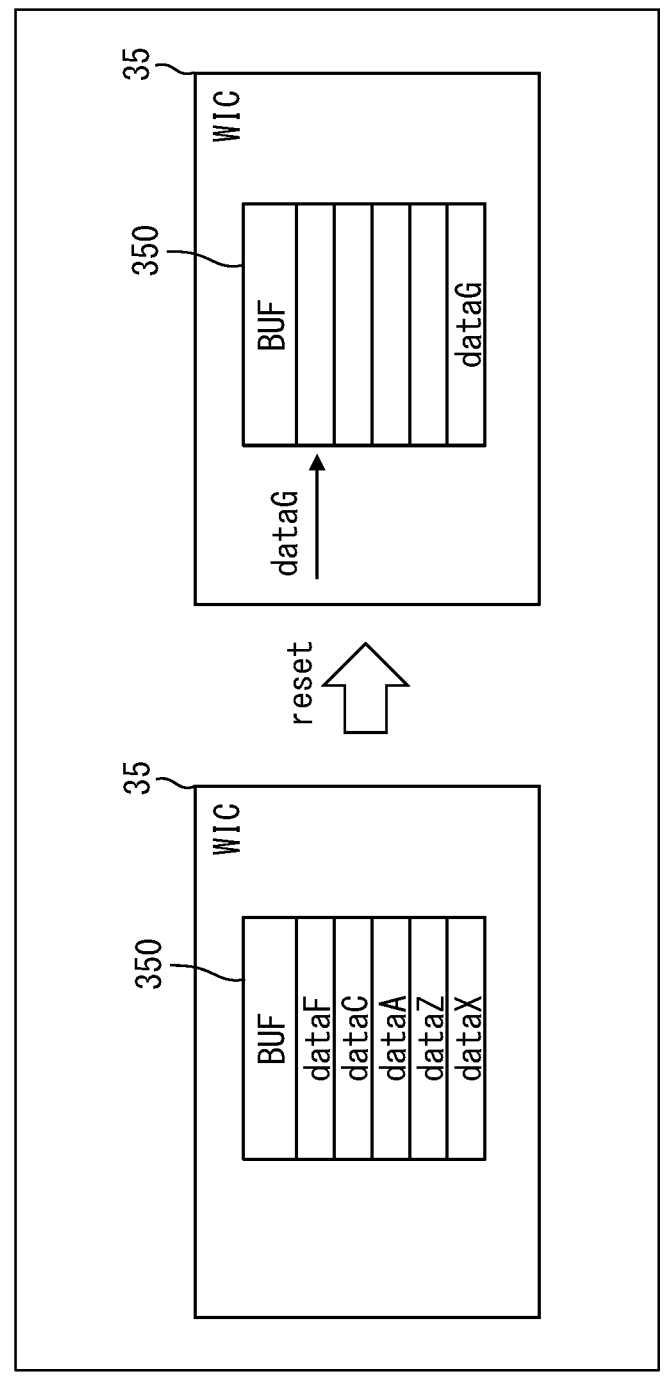
FIG. 11 is a diagram showing data deletion executed by a wireless IC in a battery management system according to a third embodiment.

FIG. 11 is a diagram showing a process executed by the wireless IC 35 in the battery management system 100 according to the present embodiment. The wireless IC 35 deletes all the monitoring data (dataX, dataZ, dataA, dataC, dataF) in the transmission buffer (BUF) 350 when the transmission buffer 350 is full, that is, when the new monitoring data acquired by the monitoring IC 33 cannot be accumulated in the transmission buffer 350. In other words, the wireless IC 35 returns the transmission buffer 350 to the initial state where the monitoring data is not accumulated. As a result, the newly acquired monitoring data (dataG) can be accumulated in the transmission buffer 350.

The wireless IC 35 may determine whether or not there is a vacancy based on the accumulation information of the monitoring data in the transmission buffer 350, and if it is determined that there is no vacancy, all the data of the transmission buffer 350 may be deleted at once. For example, all the data may be deleted by hard processing such as power-on reset. All the data may be deleted by performing a reset process on a software.

Further, a connection establishment state between the monitoring device 30 and the control device 40 may be canceled, and all the data may be deleted with the cancellation. In this case, a connection establishment work such as so-called pairing is required again. Further, the control device 40 may determine the availability of the transmission buffer 350 and transmit an instruction to delete all the data accumulated in the transmission buffer 350 to the monitoring device 30. When the monitoring device 30 receives the instruction to delete all the data, the monitoring device 30 deletes all the data of the transmission buffer 350 at once. The control device 40 may determine the availability of the transmission buffer 350 based on, for example, the untransmitted accumulation information and the communication establishment information.

Summary of Third Embodiment

As described above, in the present embodiment, when the transmission buffer 350 is full, the wireless IC 35 deletes all the monitoring data in the transmission buffer 350. Therefore, when the communication environment between the monitoring device 30 and the control device 40 deteriorates and communication abnormality, that is, communication failure continues, it is possible to suppress that the newly acquired monitoring data cannot be transmitted. For example, in a configuration in which the additional transmission and reception process is executed, it is possible to suppress that the newly acquired monitoring data cannot be transmitted within the acquired cycle.

<Modification>

The timing for deleting all the data accumulated in the transmission buffer 350 is not limited to the state where the transmission buffer 350 is full. For example, the number of data that can be transmitted in one transmission and reception cycle may be smaller than the number of data that can be accumulated in the transmission buffer 350. In such a case, when the number of data accumulated in the transmission buffer 350 exceeds the number of data that can be transmitted in one cycle, the wireless IC 35 may delete all the data accumulated in the transmission buffer 350.

Figure 12:
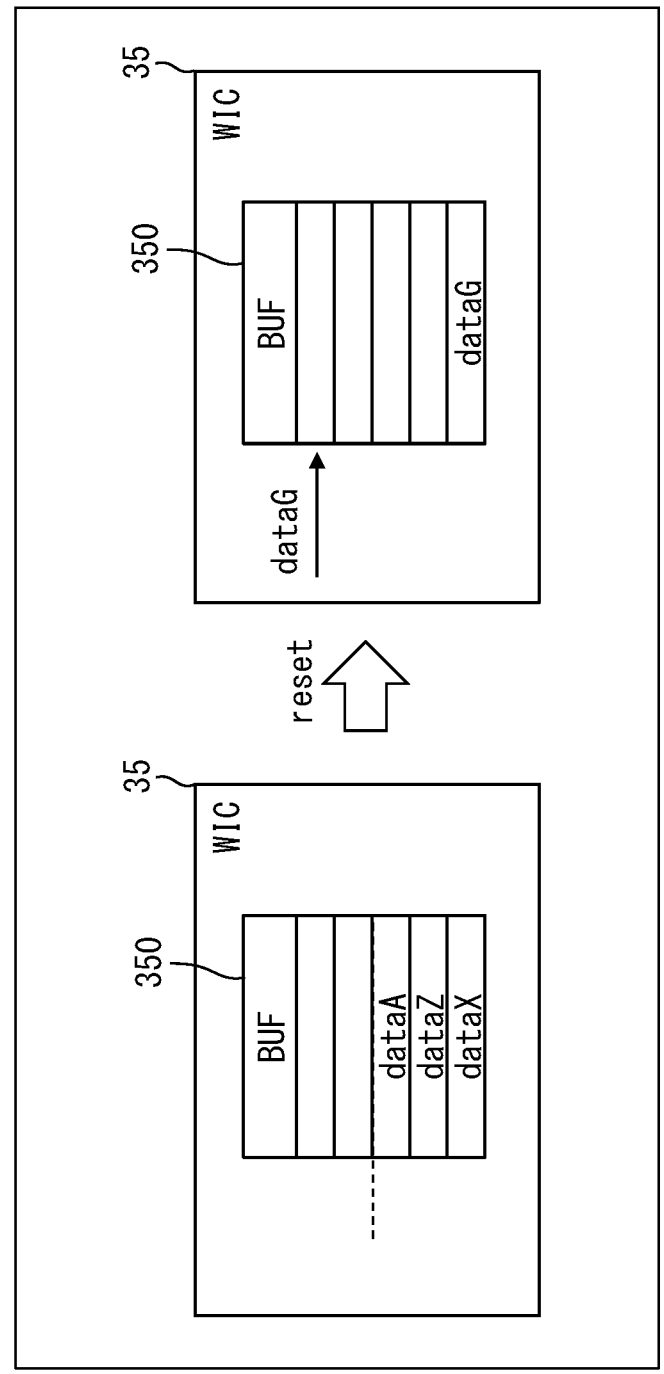
FIG. 12 is a diagram showing another example of data deletion executed by the wireless IC.

For example, when the number of data that can be transmitted from the monitoring device 30 in one cycle is three, as shown in FIG. 12, three monitoring data (dataX, dataZ, dataA) are accumulated in the transmission buffer (BUF) 350. Since four monitoring data will be accumulated when a newly acquired monitoring data is included, the wireless IC 35 deletes all the monitoring data in the transmission buffer 350. As a result, the newly acquired monitoring data (dataG) can be accumulated in the transmission buffer 350.

The deletion of all the data shown in the third embodiment and the modification can be combined with any of the preceding embodiments.

Other Embodiments

The disclosure in this specification, the drawings, and the like is not limited to the exemplified embodiments. The disclosure encompasses the illustrated embodiments and variations thereof by those skilled in the art. For example, the disclosure is not limited to the parts and/or combinations of elements shown in the embodiments. The disclosure may be implemented in various combinations. The disclosure may have additional portions that may be added to the embodiments. The disclosure encompasses omission of components and/or elements of the embodiments. The disclosure encompasses the replacement or combination of components and/or elements between one embodiment and another. The disclosed technical scope is not limited to the description of the embodiments. It should be understood that some disclosed technical ranges are indicated by description of claims, and includes every modification within the equivalent meaning and the scope of description of claims.

The disclosure in the specification, the drawings and the like is not limited by the description of the claims. The disclosures in the specification, the drawings, and the like encompass the technical ideas described in the claims, and further extend to a wider variety of technical ideas than those in the claims. Therefore, various technical ideas can be extracted from the disclosure of the specification, the drawings and the like without being limited to the description of the claims.

When an element or a layer is described as "disposed above" or "connected", the element or the layer may be directly disposed above or connected to another element or another layer, or an intervening element or an intervening layer may be present therebetween. In contrast, when an element or a layer is described as "disposed directly above" or "directly connected", an intervening element or an intervening layer is not present. Other terms used to describe the relationships between elements (for example, "between" vs. "directly between", and "adjacent" vs. "directly adjacent") should be interpreted similarly. As used herein, the term "and/or" includes any combination and all combinations relating to one or more of the related listed items. For example, the term A and/or B includes only A, only B, or both A and B.

Spatial relative terms "inside", "outside", "back", "bottom", "low", "top", "high", etc. are used herein to facilitate the description that describes relationships between one element or feature and another element or feature. Spatial relative terms can be intended to include different orientations of a device in use or operation, in addition to the orientations depicted in the drawings. For example, when the device in the figure is flipped over, an element described as "below" or "directly below" another element or feature is directed "above" the other element or feature. Therefore, the term "below" can include both above and below. The device may be oriented in the other direction (rotated 90 degrees or in any other direction) and the spatially relative terms used herein are interpreted accordingly.

The device, the system and the method therefor which have been disclosed in the present disclosure may be realized by dedicated computers which constitute processors programmed for executing one or more functions concretized by computer programs. Also, the device and the method therefor which have been described in the present disclosure may be also realized by a special purpose hardware logic circuit. Furthermore, the device and the method described in the present disclosure may be implemented by one or more dedicated computers configured by a combination of a processor executing a computer program and one or more hardware logic circuits. The computer program may be stored, as instructions to be executed by a computer, in a tangible non-transitory computer-readable medium. Namely, the means and/or the functions which are provided by the processor and the like may be provided by software stored in tangible memory devices and computers for executing them, only software, only hardware, or a combination thereof. For example, some or all of the functions provided by the processor may be realized as hardware. A mode in which a certain function is realized as hardware includes a mode in which one or more ICs are used. The processor may be realized by using an MPU, a GPU, or a DFP instead of the CPU. The processor may be realized by combining multiple types of arithmetic processing units such as a CPU, an MPU, and a GPU. The processor may be realized as an SoC. Further, various processing units may be realized by using FPGA or ASIC. The various programs may be stored in a non-transitional substantive recording medium. As the storage medium for the programs, various storage media such as an HDD, an SSD, a flash memory, and an SD card can be adopted. DFP is an abbreviation for Data Flow Processor. SoC is an abbreviation for System on Chip. FPGA is an abbreviation for Field Programmable Gate Array. ASIC is an abbreviation for Application Specific Integrated Circuit. HDD is an abbreviation for Hard Disk Drive. SSD is an abbreviation for Solid State Drive. SD is an abbreviation for Secure Digital.

Figure 13:
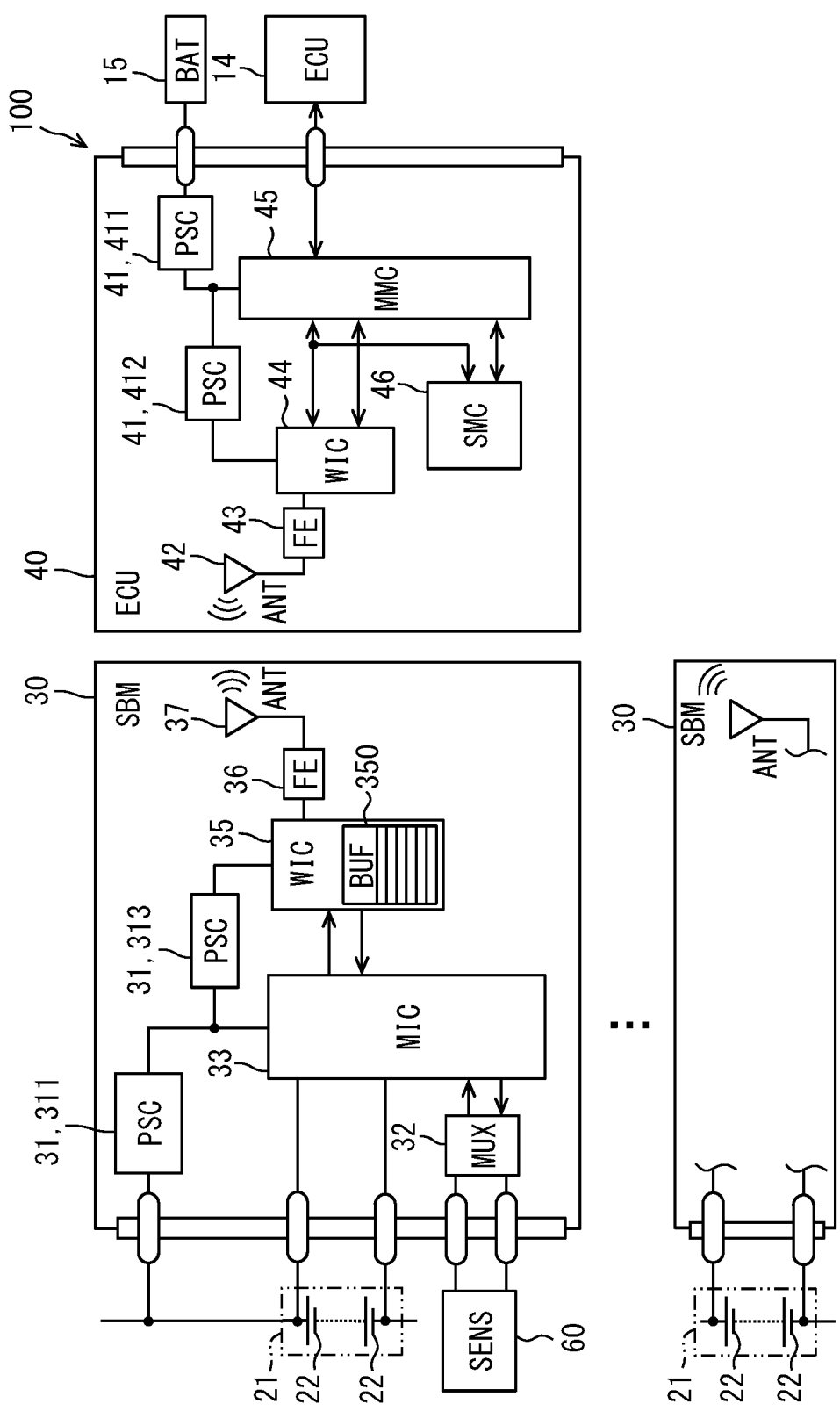
FIG. 13 is a block diagram showing another configuration example of a battery management system.

For example, an example has been described in which the monitoring device 30 includes the microcomputer 34, but the present disclosure is not limited thereto. As shown in FIG. 13, a battery management system 100 in which the monitoring device 30 does not include the microcomputer 34 may be adopted. FIG. 13 corresponds to FIG. 4. In this configuration, the wireless IC 35 transmits and receives data to and from the monitoring IC 33. The wireless IC 35 may execute the sensing by the monitoring IC 33 and the schedule control of the self-diagnosis, or the main microcomputer 45 of the control device 40 may execute the schedule control.

An example has been described in which the periodic data (TxA) as the request data periodically transmitted by the control device 40 includes the acquisition request and the transmission request of the monitoring data including the battery information, but the present disclosure is not limited thereto. The periodic data may include only the transmission request of the monitoring data without including the acquisition request of the monitoring data. The monitoring device 30 may acquire the monitoring data at a predetermined cycle set in advance according to the transmission and reception cycle, instead of acquiring new monitoring data triggered by the acquisition request from the control device 40. The predetermined cycle corresponds to, for example, one cycle of transmission and reception.

An example of arranging the monitoring device 30 for each of the respective battery stacks 21 has been shown, but the present disclosure is not limited thereto. For example, one monitoring device 30 may be arranged for multiple battery stacks 21. Multiple monitoring devices 30 may be arranged for one battery stack 21.

An example has been described in which the battery pack 11 includes one control device 40, but the present disclosure is not limited thereto. The battery pack 11 may include multiple control devices 40. That is, the battery pack 11 may include one or more monitoring devices 30 and one or more control devices 40. The battery management system 100 may include multiple sets of wireless communication systems constructed between one control device 40 and one or more monitoring devices 30.

An example has been described in which the monitoring device 30 includes one monitoring IC 33, but the present disclosure is not limited thereto. The monitoring device 30 may include multiple monitoring ICs 33. In this case, the wireless IC 35 may be provided for each of the monitoring ICs 33, or one wireless IC 35 may be provided for the multiple monitoring ICs 33.

The arrangement and number of the battery stacks 21 and the battery cells 22 constituting the assembled battery 20 are not limited to the above example. In the battery pack 11, the arrangement of the monitoring device 30 and/or the control device 40 is not limited to the above example.

What is claimed is:

1. A battery management system comprising:
a monitoring device including a monitoring integrated circuit (IC) configured to acquire and monitor battery information indicating a battery status, and a wireless IC configured to transmit and receive data to and from the monitoring IC and capable of performing wireless communication; and
a control device including a microcomputer programmed to perform wireless communication with the wireless IC and execute a predetermined process based on the battery information, wherein
the microcomputer in the control device is further programmed to transmit request data requesting transmission of the battery information to the monitoring device,
the wireless IC is configured to transmit response data including the battery information to the control device in response to receiving the request data,
the microcomputer in the control device is further configured to make next request data include communication establishment information that is capable of distinguishing between communication establishment in which the response data with respect to the request data is received and communication failure in which the response data with respect to the request data is not received, and transmit the next request data,
the request data includes periodic data transmitted in a predetermined cycle,
the wireless IC includes a transmission buffer capable of individually accumulating the battery information a plurality of times that is acquired by the monitoring IC,
the wireless IC is further configured to transmit, to the control device, the battery information in the transmission buffer with respect to the request data, and
the wireless IC is further configured to delete the battery information corresponding to the communication establishment from the transmission buffer, and hold the battery information corresponding to the communication failure in the transmission buffer based on the communication establishment information.

2. The battery management system according to claim 1, wherein
the wireless IC is further configured to make the response data include first battery information and untransmitted accumulation information of second battery information and transmit the response data to the microcomputer in response to a first request data as the request data,
each of the first battery information and the second battery information is the battery information for one time accumulated in the transmission buffer,
the untransmitted accumulation information of the second battery information indicates that the second battery information different from the first battery information is untransmitted, and
the microcomputer is further configured to transmit, to the monitoring IC, second request data requesting transmission of the second battery information as the request data in a same cycle as the first request data in response to receiving the untransmitted accumulation information of the second battery information.

3. The battery management system according to claim 2, wherein
the microcomputer is further configured to transmit the second request data including the communication establishment information indicating the communication establishment on condition that the microcomputer receives the response data including the first battery information with respect to the first request data, and
the wireless IC is further configured to delete the first battery information for which communication is established from the transmission buffer and transmit the second battery information accumulated in the transmission buffer to the microcomputer in response to the second request data from the microcomputer.

4. The battery management system according to claim 2, wherein
the microcomputer is further configured to transmit the second request data including the communication establishment information indicating the communication failure on condition that a reception error occurs while the microcomputer receives the response data including the first battery information with respect to the first request data, and
the wireless IC is further configured to transmit the second battery information accumulated in the transmission buffer to the microcomputer while holding the first battery information in the transmission buffer without deleting the first battery information in response to the second request data from the microcomputer.

5. The battery management system according to claim 1, wherein
the wireless IC is further configured to delete all data in the transmission buffer on condition that there is no vacancy in the transmission buffer.

6. The battery management system according to claim 1, wherein
the wireless IC is further configured to delete all data in the transmission buffer on condition that a number of data accumulated in the transmission buffer exceeds a number of data capable of being transmitted in one cycle.

7. The battery management system according to claim 1, wherein
the periodic data includes an acquisition request and a transmission request of the battery information, and
the monitoring IC is further configured to acquire the battery information in response to the acquisition request.

8. The battery management system according to claim 1, wherein
the wireless IC is further configured to delete all the battery information accumulated in the transmission buffer on condition that a power supply of the battery management system is turned off.

9. The battery management system according to claim 1, wherein
the microcomputer is further configured to determine whether a communication error occurs in response to receiving voltage data included in the response data, and request the wireless IC to retransmit the voltage data when determining that the communication error occurs.

10. The battery management system according to claim 1, wherein
the battery management system is configured to be installed in a vehicle, and
the microcomputer is further configured to calculate the battery status from the battery information based on an ignition signal of the vehicle.

* * * * *